United States Patent [19]
Carrubba et al.

[11] 4,149,218
[45] Apr. 10, 1979

[54] MINIMUM DELAY MODULE ASSEMBLY

[75] Inventors: Francis P. Carrubba, North Haven, Conn.; Paul E. Stuckert, Katonah, N.Y.

[73] Assignee: International Business Machines Corporation, Armonk, N.Y.

[21] Appl. No.: 866,193

[22] Filed: Dec. 30, 1977

[51] Int. Cl.² .............................................. H05K 7/20
[52] U.S. Cl. .................................... 361/383; 361/384; 62/418; 165/80; 361/394
[58] Field of Search .................................. 62/417–422; 165/53, 54, 80; 361/381–384, 389, 393–395; 174/15 R, 16 R

[56] References Cited
U.S. PATENT DOCUMENTS

| 3,147,403 | 9/1964 | Cressman | 361/394 |
| 3,874,444 | 4/1975 | Perce | 165/80 |
| 3,956,673 | 5/1976 | Seid | 62/418 |

*Primary Examiner*—Gerald P. Tolin
*Attorney, Agent, or Firm*—Roy R. Schlemmer, Jr.

[57] ABSTRACT

A Minimum Delay Module Assembly, having unrestricted accessibility for servicing, that provides substantially constant electrical and thermal environments for all portions of the assembly regardless of configuration. The assembly comprises a plurality of vertical page modules in which each page module is vertically hinged to the adjacent page module. Electrical interconnections are provided between the page modules by means of cable assemblies which enter each page module in the edge thereof adjacent said hinges. Individual self contained cooling means are provided for each page module so that the flow of air is up through the bottom of each page module and out through the top thereof. Resilient conduit means may be utilized to supply a pressurized coolant to each page module regardless of the configuration of the module assembly. The complete vertically hinged module assembly is supported on a base assembly, including a foraminous base member sufficiently large to support said hinged module assembly when in the closed position and further including at least one foraminous foldable shelf which folds out of the way when the assembly is in the closed position and folds to a position coplanar with said base member when in the "open for service" position. The base assembly further includes a chamber or space under the base member which provides for an unrestricted flow of air up through said base member.

12 Claims, 8 Drawing Figures

MINIMUM DELAY MODULE ASSEMBLY

BACKGROUND OF THE INVENTION

The present invention relates broadly to an electronic packaging assembly for mounting, powering, interconnecting, and cooling the component circuitry comprising electronic systems such as digital computers.

A requirement of such packaging assemblies is that they obviously must support the required electronic circuitry, provide for cooling of the circuitry and provide for accessibility to the various components and subassemblies whenever servicing is required. In modern electronic systems and especially in electronic computers, the increasing use of large scale integration techniques with the attendant miniaturization of such circuit assemblies greatly complicates the provision of the following features which should be incorporated into such a structure if an optimum design is to be obtained.

The first feature is the provision of an electrical environment which recognizes that modern computer technology has progressed to the point that, where high speed circuitry is utilized, the speed advantages can only be realized by utilizing transmission lines for effecting optimal signal transfer between various components and subsystems. It is thus of primary importance that the connecting cables between the various subassemblies be maintained as short as possible to minimize delay in signal propagation. It is further necessary that this electrical environment (i.e., propagation time) remain substantially constant regardless of the configuration of the assembly, i.e., closed or open for servicing.

A second important feature for such packaging assemblies is the provision of adequate cooling for the components which are mounted in the circuit boards, which cooling must be available in unrestricted fashion, regardless of the configuration of the system.

Another important feature which should be present in such an assembly is that of an overall structure which allows substantially unrestricted access to any portion of the circuitry located in any of the subassemblies while, at the same time, maintaining substantially constant electrical and thermal environments.

It is a further desirable feature that such a packaging system allow good accessibility to many sections of the computer concurrently.

In the past computer assemblies have been organized as a plurality of large circuit boards wherein each board is provided with a plurality of smaller printed circuit boards or cards mounted thereon. It is further known to mount each of the larger boards in a cabinet subassembly provided with rollers or guides such that each large board may be accessed like a drawer. Additionally, the entire cabinet assembly has been provided with a large blower or fan such that cooling air is forced over the components on all of the boards when in a closed position and the unit is operating. However, most prior art packaging structures or assemblies have not been provided with cooling means which performed adequately when individual modules are in the open or "service" position. With prior art electronic technologies the heat dissipation requirements were relatively small and an individual module could usually be temporarily slid out of its cabinet for servicing without danger of over heating. However, subsequent advances in the state of the art, as set forth above, have produced circuitry which has very high heat dissipation, since large scale integration results in closely spaced components which are individually greatly reduced in size and which operate at elevated temperatures. Further, the circuitry operates most effectively when temperature variations are small. Thus, they must ideally be provided with a substantially constant thermal environment.

From the foregoing it may be seen that the design of a practical packaging assembly for such electronic circuitry organized into a series of separately accessible modules is neither obvious nor trivial.

Copending application Ser. No. 811,755 filed June 30, 1977 of P. E. Stuckert entitled "Cooling Scheme for Electronic Circuits" discloses a method and apparatus for providing efficient ambient air cooling of densely populated high heat dissipating electronic assemblies. It utilizes a plurality of pressurized air jets which entrain ambient air which, in turn, cause large volumes of coolant flow over the circuitry mounted on the circuit board assembly.

Throughout this specification the following definitions apply to the various assemblies and subassemblies constituting the presently disclosed packaging system.

Module assembly: the entire structure including the base support assembly, the air chamber, the shelves, the plurality of vertical page modules mounted on the base member, the electrical interconnection cable assemblies, and the pressurized fluid supply.

Page module: the individual vertical page-like subassemblies or modules which have the same height and depth but which may have different widths.

Base member: the upper foraminous surface of the base assembly, preferably a open grating in which the page modules rest.

Hinged module assembly: the assembly comprising the page modules which are vertically hinged to each other, which assembly rests on the base member.

Support shelves: the foraminous members hingedly attached to either side of the base member which fold up along the sides of the hinged module assembly when it is in the closed position and which fold down to form an enlarged support surface coplanar with said base member and adapted to support said page modules when the hinged module assembly is in the opened position.

SUMMARY OF THE INVENTION

It has been found that a minimum delay modular assembly having unrestricted accessibility to all page modules making up the assembly may be realized. Each module carries its own cooling means regardless of configuration. The module assembly is organized as a series of vertical page modules wherein each page module is hinged to its adjacent page module. Said hinged module assembly may either be closed for normal operation or opened to provide unrestricted accessibility to any of said page modules. Minimum delay electrical interconnections may readily be provided to such a structure as well as highly efficient cooling means which is carried by each page module regardless of the system configuration.

OBJECTS OF THE INVENTION

It is a primary object of the present invention to provide a modular page-oriented electronic packaging system.

It is a further object to provide such a packaging system which comprises a minimum delay module assembly having unrestricted accessibility to all modules.

It is yet another object of the invention to provide such an assembly comprising a plurality of individually accessible vertical page modules.

It is a still further object of the invention to provide said packaging system wherein each page module is provided with a substantially constant thermal environment regardless of the system configuration.

It is yet another object of the invention to provide such a packaging system wherein the individual page modules are electrically interconnected by lines having minimum length, and electrical delay, and are of constant lengths regardless of the system configuration.

It is a still further object of the invention to provide such a packaging system wherein the individual page modules have a substantially constant electrical environment regardless of the system configuration.

It is another object of the invention to provide such a packaging assembly uniquely suited to cooling via pressurized jet entrainment of ambient air.

It is a still further object of the invention to provide such a packaging system including a base and support structure for supporting the individual page modules in a wide variety of servicing configurations as well as the normal, or closed, operating configuration without affecting the operating electrical or thermal environment of said page modules.

It is a still further object to provide such a minimum delay module assembly which may be stacked both vertically and horizontally with other similar assemblies.

Other objects, features and advantages of the invention will be apparent from the following description of the invention as set forth in the specification and drawings.

DESCRIPTION OF THE PREFERRED EMBODIMENT

Figure 1:
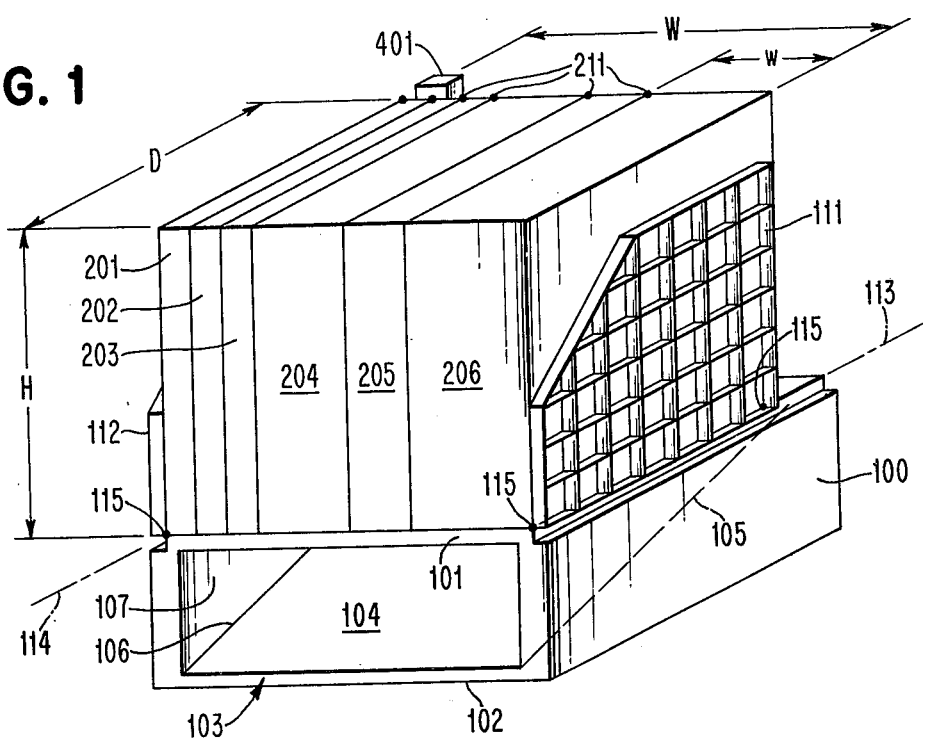
FIG. 1 comprises an isometric front view of a simplified version of a minimum delay modular packaging assembly, in closed position, constructed in accordance with the present invention.

The objects of the present invention are accomplished in general by a modular page oriented electronic packaging system for use in high density electronic computer systems wherein said packaging system comprises a minimum delay module assembly comprising a plurality of vertical page modules, hinge means for joining each of said page modules to each other, means for vertically mounting each page module on a base support assembly wherein a first page module is fixedly hinged to said support assembly for pivotal movement thereon and wherein each adjacent page module is individually hinged to its immediately adjacent neighbor. A separate cooling means is provided for each said page module, said cooling means providing for the passage of air from the bottom of said page module and out through the top thereof. Flexible cable means of a minimum, fixed length are provided for interconnecting said page modules to each other and to said support assembly. Said base support assembly includes a foraminous base member which permits the passage of coolant air therethrough regardless of the orientation of the page modules on said support assembly.

The preferred embodiment of said structure is further characterized in that the individual cooling means for each of said page modules may comprise an air inductor which utilizes a pressurized fluid nozzle located within each said page module for entraining and moving ambient air from the bottom of said page modules over the circuitry mounted therein and out through the top thereof. Said pressurized fluid for each said page module cooling means is supplied via a flexible conduit for connecting said cooling means to the said base support assembly. Additionally, integral shelf means may be hingedly attached to said base assembly wherein, when said shelves are in the lowered or down position, the individual page modules constituting said hinged module assembly may be disposed in a wide variety of positions across said base and shelf surface to provide for access to more than one page module at a single time. Each said shelf is similarly provided with a foraminous surface whereby uninterrupted air flow to each individual page module is present regardless of the module orientation.

The advantages of the present invention will be more readily apparent when it is realized that electronic circuits such as those used in digital computers are becoming faster and more integrated with the passage of time. As stated previously, these increases in circuit speed and density are, typically, accompanied by increased heat dissipation requirements both on a per circuit component basis and a per unit of board area basis. Such faster circuitry also requires that interconnecting signal lines be bonafide transmission lines whose lengths must be minimized and constant. Because of its relatively low cost and simplicity, especially when compared with more complex cooling systems such as chilled liquids or refrigerants, air cooling is a preferred method of heat removal. The present invention relates specifically to a modular electronic packaging system utilizing air as the cooling medium.

While the packaging system of the present invention is intended primarily for large electronic systems of which digital electronic computers are the best known members, it is to be understood that the basic principals of the invention would be applicable to other types of electronic systems than computers.

Before proceeding with a detailed description of the preferred embodiment of such a packaging system, the following is a synopsis of the desirable characteristics incorporated in the packaging and support system of the present invention. The structure utilizes modular construction wherein various electrical or electronic subassemblies are built into separate modules. As will be apparent from the following description, these modules are constructed to resemble the pages of a book which may be opened for access and/or removal when desired. They are accordingly referred to herein as page modules. The relative ease with which such page modules may be opened for access and service, and even removal, will be apparent from the following description. Due to the physical configuration of the present structure, the overall assembly may be opened to afford ready access to both sides of a given page module with minimum interference from the adjacent page modules. It will also be noted that excellent access may be provided for two or even three page modules concurrently.

The present structure also provides a novel cable harness assembly, connectors, and the like which, together with the hinged structure of the overall assembly, provide minimum delay transmission lines interconnecting the individual modules which are kept to a minimum length. It is also possible to gain access to the individual page modules without altering the length of these transmission lines such as by extender modules, extender cards, extender cables, or leads or other devices which are normally used in the art to provide signal path connections as well as power when a particular module is moved out of its normal place in the equipment. As a result of the short and constant length cable assembly maintanence and repair operations on a given page module are possible without in any way varying its electrical environment. Changes in the electrical environment can also occur due to changes in the thermal environment when normal coolant flow is not available for the assembly such as when a module is removed for service. This might in turn cause a temperature rise and a resulting departure from normal electrical operating characteristics of the circuitry. This would of course render servicing more difficult. For the above reasons, the present modular packaging system provides an invariant thermal environment for the module in that, regardless of the position of individual pages, a substantially uninterrupted coolant flow is available to maintain operating temperatures within specified ranges.

In summary, the present packaging system allows the electronic system to operate in a completely normal and uninterrupted mode regardless of whether the individual modules are in their completely closed and normal operating position or in an open-for-service position. All electrical and thermal characteristics remain substantially unaltered which allows maintenance and service to be performed under invariant operating conditions.

Figure 2:
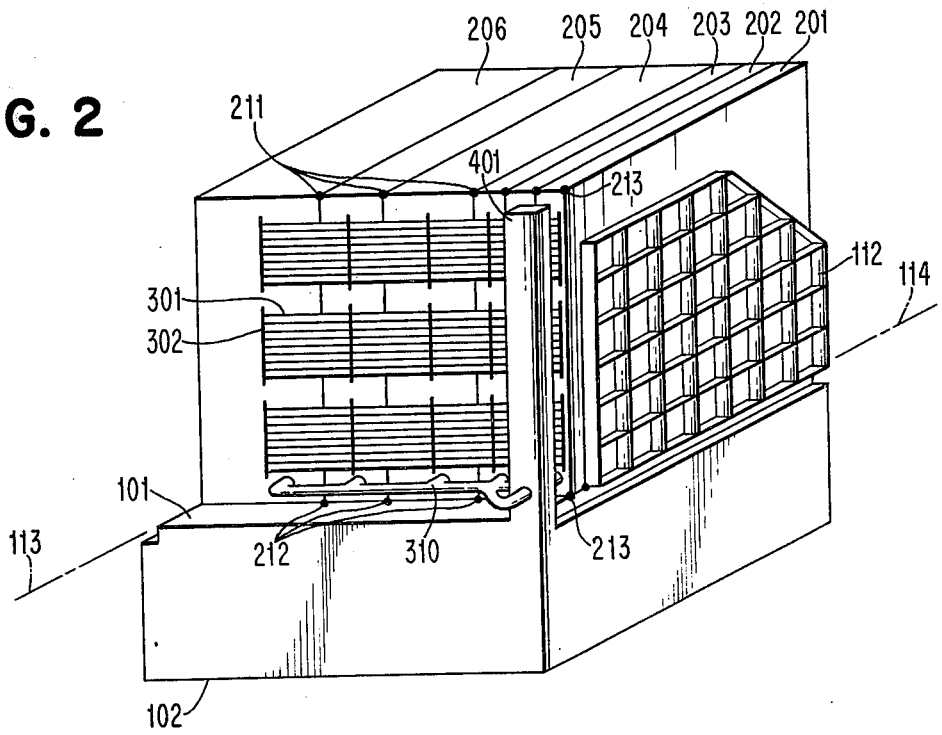
FIG. 2 comprises a rear isometric view of the assembly shown in FIG. 1.
Figure 3:
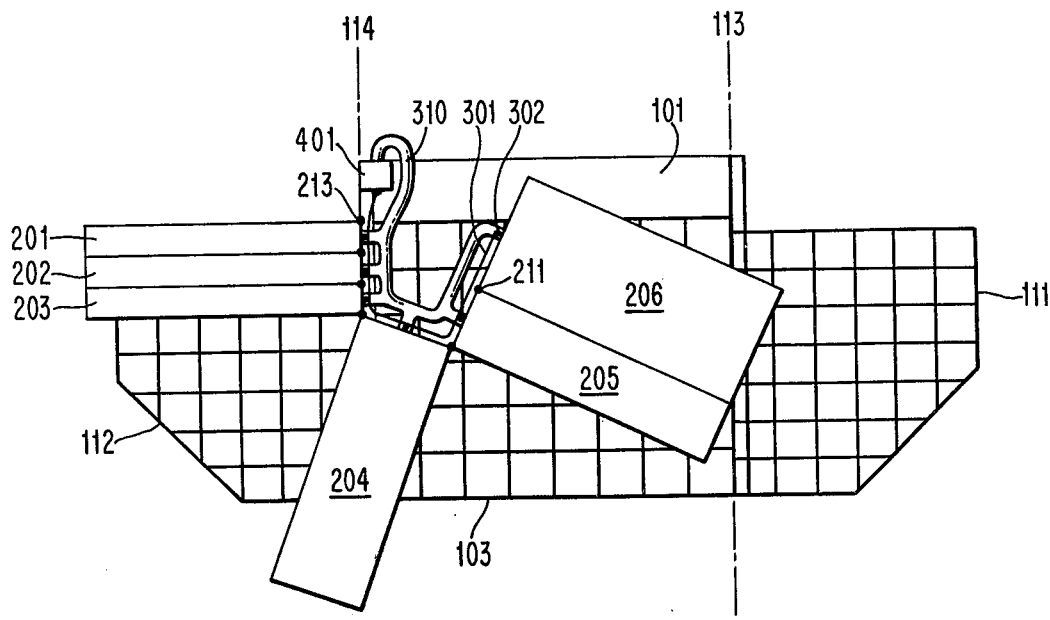
FIG. 3 comprises a top view of the electronic packaging assembly set forth in FIG. 1 showing the system in an open-for-servicing position.

Referring now to the figures, the details of the present structure will be set forth and described. FIGS. 1 and 2 are front and rear isometric views respectively of the module assembly in its normal or closed position. FIG. 3 is a top view of the module assembly opened for construction, repair, or maintenance. In all three views the same components are labeled identically. It will also be understood that in all three views it is assumed that any external covers have been removed or swung away. For example, a five sided housing open at the bottom could be provided to cover the entire module assembly and rest on the upper edges of the base support assembly as will be well understood. Alternatively, such a covering could be constructed from five separately removable panels. In any event, the covering structure would be essentially obvious to one skilled in the art and forms no part of the present invention.

The base support assembly 100 comprises in essence a tapered plenum chamber having an upper member 101 which actually serves as the support surface or base member for the page modules 201 through 206 mounted thereon. The air plenum chamber is an upwardly sloping area formed by surface 104 which is shown sloping upwardly by the two lines 105 and 106, the opening 103 in the front of the base 100, the two sides 103, and the upper surface 101. 102 depicts the bottom or support for the entire assembly as will be evident from the drawing. The surface 101 may be a planar open grating having approximately 80% open space through which cooling air is admitted to the bottoms of the modules 201 and 206. As will be apparent, the openings in the surface 101 and also in the two service shelves 111 and 112 whose function will be explained subsequently may be formed from a grating (as shown), by expanded metal techniques, a series of holes or any other convenient means which will provide the adequate air flow required. The cooling air enters the base assembly through the front opening designated by the numeral 103 and is direct upwardly by the solid inclined sheet 104. The path for the cooling air is thus in through the front opening 103, up through the base member 101 and then up through the page modules and out their tops.

As indicated in FIG. 1 all of the page modules 201 through 206 have the same heights H and the same depths D. The overall width W for the hinged module assembly is fixed, however, any of the particular modules may have a differing width $w_i$. However, as will be apparent the sum of all the widths $w_i$ equals the total width of the overall hinged module assembly W.

Referring now to FIG. 2 the heavy dots 211 and 212 represent hinge points for the individual page modules wherein it will be noted that all adjacent page modules are hinged together at their backs so that they form an openable, but complete and rigidly connected assembly. Each page module is hinged at opposite edges of the back surface to its two adjacent neighbors so that these are two hinge axes associated with each page module (except the two ends). This, as is apparent, allows the entire hinged module assembly to be completely closed. The complete assembly is permanently attached to the base at one hinge point such as shown at one end of the module assembly by the axis hinge defined by the points 213. As will be apparent, alternatively, the hinged module assembly could be hinged to the vertical column 401 with minor modifications. Thus, it will be seen that the entire hinged module assembly is organized like the pages of a book and may be hinged opened as will be more apparent from the subsequent description of FIG. 3.

The contents and internal construction of individual page modules is subject to wide variations and only a limited number of examples are discussed in the following as being typical of the requisite construction features which will allow a full utilization of the present packaging concept. Their tops and bottoms must be substantially open to permit free entrance and exit of cooling air. The bottoms should be fitted with a suitable dust filter. Sides, front, and back (or, alternatively, an internal duct structure) must be provided and so constructed that substantially all air which enters the bottom of the page module is directed over the components which require cooling and subsequently exits through the top of the page module. Finally, air moving means which is totally self contained within each page module must be provided, typically, immediately above each page module's input filter. This air moving means may range from natural convection for page modules which require lower coolant flow due to lower heat dissipation characteristics to fans, blowers or air inductors for page modules which have much higher heat dissipations. The preferred embodiment of the invention which will be described subsequently, utilizes such air inductors. An air inductor system is uniquely adapted for use with the present construction as such an air induction supply may be provided to each page module by the use of resilient conduits in much the same fashion as the resilient cabling is used to interconnect the page modules electrically.

Beyond the above required features, the designer has substantially complete freedom in page module design. Narrow page modules such as 201, 202 and 203 of FIG. 1 may contain a single circuit board on which components are mounted. Wide page modules such as 204 and 206 may incorporate card on board construction in which both cards and boards are oriented preferably in vertical planes to facilitate cooling by the upward movement of air.

Referring now to FIGS. 1, 2 and 3 the structure of the hinged shelves 111 and 112 will be set forth. These are support shelves which are hinged to the base member 101 along the axes 113 and 114 as shown. These hinges are depicted by the dots 115 as with the hinges 211 and 212 which hinge the individual module assemblies to each other. These shelves are ideally planar open gratings similar to the base member 101 as discussed above. As will be apparent, the open gratings allow the substantially unrestricted flow of air up through the surface of these shelves. FIGS. 1 and 2 show the basic module assembly in its normal or closed condition with the shelves folded up and out of the way. Thus, in this position a suitable covering cabinet or panels can be mounted over the entire module assembly for a neat appearance and for physical protection.

FIG. 3 which is a top view of the module assembly illustrates the orientation of the shelves 111 and 112 when folded down into a horizontal supporting position in which their tops are coplanar with the top of the base support surface 101. It will also be noted from FIG. 3 that the page modules have been reoriented within the constraints imposed by the hinging pins 211 and 212 for access to both sides of the page module 204. It will also be noticed that the fixed hinge pin 213 does not move relative to the base member 101 as this is considered a fixed portion or member of the system. However, it is free to rotate about the hinge axis. It will also be noted that one side of the page modules 201, 203, 205 and 206 are concurrently available for servicing.

It will also be apparent that many other orientations of this hinged module assembly are possible to allow concurrent access to both sides of two or even three of the page modules at one time with the result that a wide variety of maintenance and testing operations are possible concurrently within the system which allows extremel flexibility in the testing of such a system. This flexibility would have been hitherto quite difficult with structures presently available in the art.

From the above description it will be obvious that many advantageous features flow from the present packaging system by appropriate repositioning of page modules on the base member 101 and the shelves 111 and 112. Both sides of any page module can be rendered simultaneously accessible. Since each page module carries its own air inductor means and the impedance of the air flow through the base, shelves, and unobstructed page module bottom are substantially the same. All page modules operate in a substantially constant thermal environment regardless of position. By suitably constructing the hinges, base and shelves, adequate hinged module assembly support is provided regardless of the orientation of the hinged module assembly. Further, with this type of construction, total page module access is available without the provisions of extender cables or extremely long fixed cable loops which would cause significant signal delay within the cables for high speed signal transmission between the various page modules.

In this latter regard it will be noted that electrical buses for the distribution of power and signal interconnections between the page modules are indicated by the flexible flat cable assemblies 301 shown most clearly in FIG. 2. These buses may be easily fitted with connectors 302 at each module. In order to permit the reorientation of all page modules, all buses are flexible and may be made up of discrete wires, coaxial cables, flat cables, or flexible printed circuits. As will be apparent, with the present structure the maximum length of these cables is determined when the overall modular assembly is in the normal or closed position shown in FIGS. 1 and 2. Thus, if transmission lines are used they are designed to be of suitable characteristic impedances. Whenever the hinged module assembly is opened for servicing and/or repair as shown in FIG. 3 the lengths of the transmission lines is always constant in any of the 'open' configurations. It will also be noted that the cable assembly 301 is shown going to the vertical column 401 which might for example be connected to a separate power supply and could also serve to interconnect the overall module assembly with other similar modules such as will be apparent from the additional embodiments shown in FIGS. 4 and 5.

Also referring to FIGS. 2 and 3 the preferred embodiment of the invention utilizes an air induction system such as shown in copending patent application Ser. No. 811,755 referred to previously, wherein each of the page modules is supplied via a flexible (typically plastic) air bus 310 emanating from the bottom of column 401. As will be noted, this air supply is positioned to enter the bottom of each of the page modules typically just above the air filter. The internal busing and nozzle configuration for achieving suitable cooling of the particular components within a particular page module would be left to the requirements of the system design. Reference is made to the above-referenced copending application for the details of a typical installation utilizing such cooling means. It will be noted especially in FIG. 3 that the flexible air supply conduit is attached to the individual page modules via the column 401 in much the same way as the flexible conductors 310. With this arrangement the compressed air supply remains connected to the individual page modules regardless of the fact that they are opened in any desired configuration for servicing. Thus, as stated previously, each page module operates in a substantially invariant thermal environment regardless of the position of the page module at any given time.

It will further be readily appreciated that individual page modules may be removed from the assembly simply by disconnecting the bus connectors 302 which electrically connect the page module into the system, by disconnecting the pressurized air supply at the bottom of the page module, and by finally removing the hinge pins which connect the page module to its two adjacent modules. When a page module is removed for an extended period of time and no replacement is available, a dummy page module may easily be inserted to hold the overall hinged module assembly together.

In a normal operating environment all page modules would be fitted with a locking mechanism actuable from the front panel. This locking mechanism could be as simple as a series of pins which would engage holes in the base member 101 to position the page modules in their proper closed position for normal operation wherein the pins would engage holes in the individual page modules or conversely pins in the page modules could be adapted to engage holes in the base plate. Similarly, suitable locking mechanisms would be provided to maintain the shelves 111 and 112 positioned either in their open or closed position. Since such locking mechanisms are believed to be obvious to anyone skilled in the art, they are not specifically illustrated in the drawings.

Throughout the preceding description no specific dimensions D, W, or H as shown in FIG. 1 for the overall assembly have been set forth. They can, in fact, vary widely as a function of the particular system technology. Initially the basic module assembly of FIG. 1 could be visualized as having dimensions consistent with a conventional relay rack where the assembly could be either mounted on top of a short relay rack or mounted in the relay rack on slides. Considerably smaller module assemblies for use in terminals or other small devices could also readily be designed. Conversely, the disclosed module assembly could be visualized as a complete machine entity or a major component of a large machine which could be, for example, six feet high and six feet wide. However, the basic module assemblies regardless of size could be readily organized in subassemblies to permit the modular organization of the overall system as will be set forth with respect to the following description of FIGS. 4 and 5.

It should be understood that with the continued improvement of various micro fabrication and large scale integration techniques with the resultant reduction in the overall size of such large scale integrated circuit assemblies that a major computational facility could be conceivably constructed utilizing the present packaging scheme wherein the overall module assembly might have a size for example, one foot by one foot by one foot.

Figure 4A:
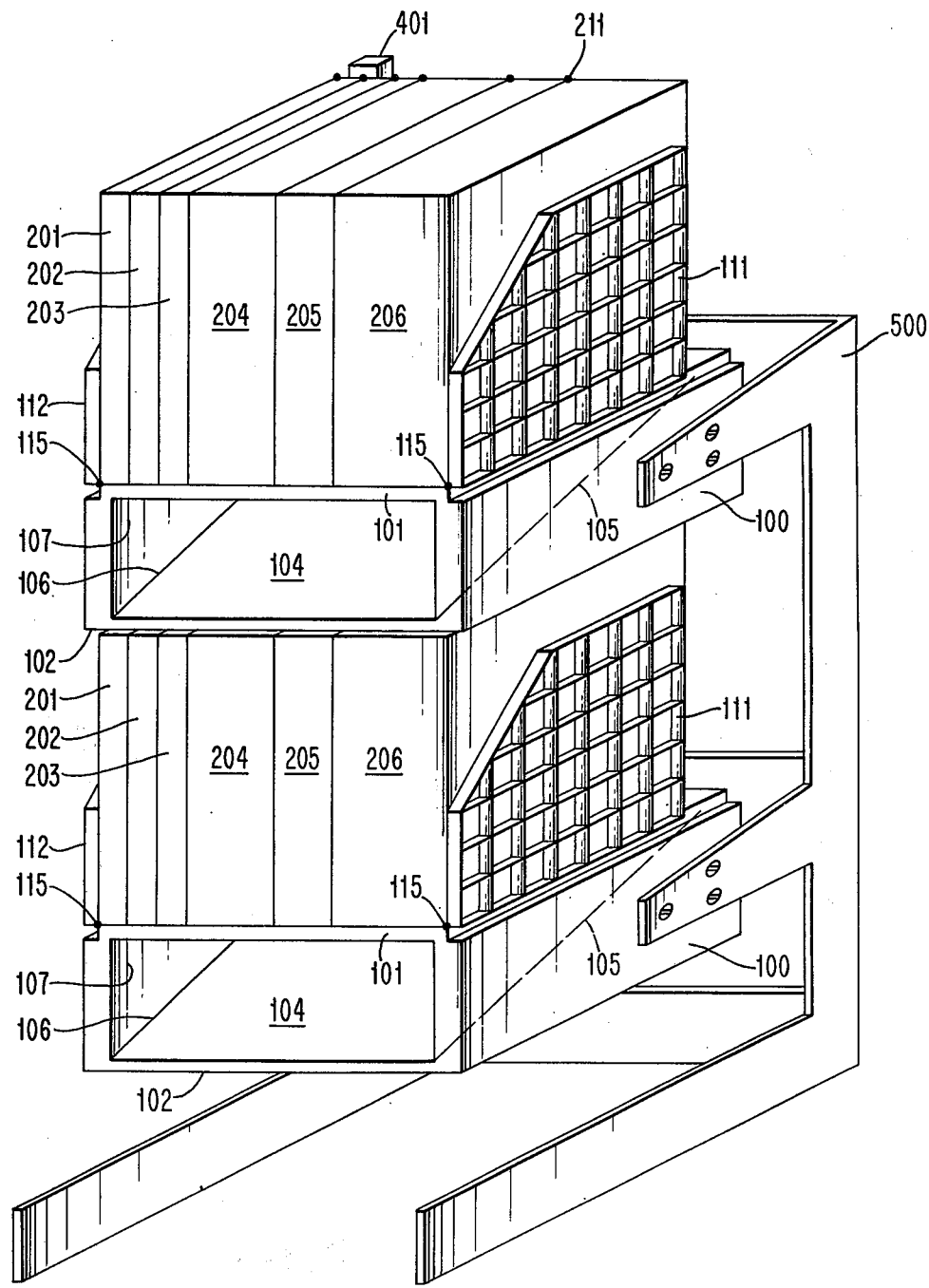
FIG. 4A is an isometric view similar to FIG. 1 showing two packaging assemblies of the type shown in FIG. 1 in a vertically stacked arrangement.
Figure 4B:
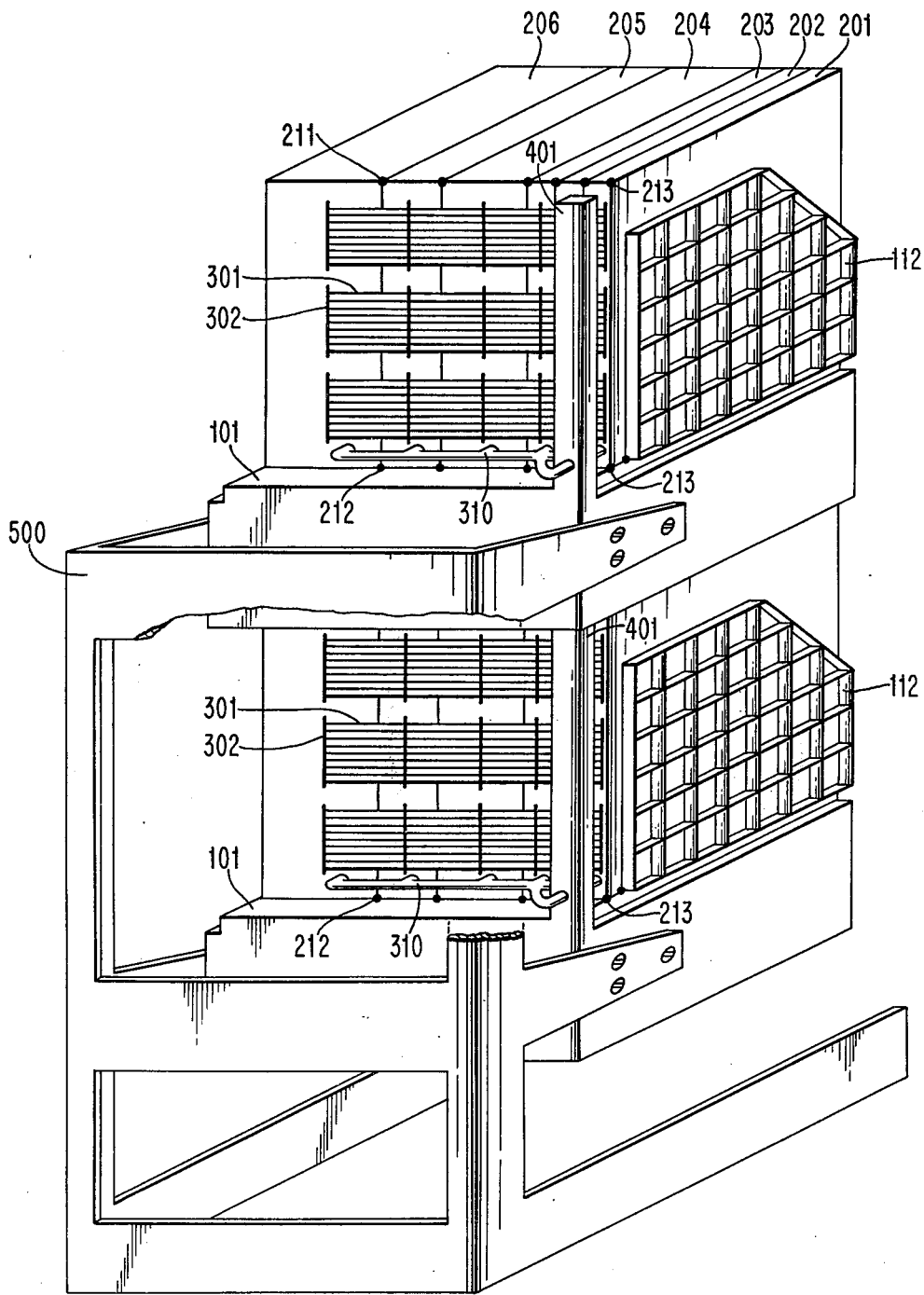
FIG. 4B is a rear isometric view showing the assembly of FIG. 4A.

Referring now to FIGS. 4A and 4B front and rear isometric views of two basic module assemblies (in closed position) of the type shown in FIG. 1, are shown, said assemblies being grouped vertically. The module assemblies could be either mounted on slides or supported in cantilever fashion from the back by a vertical supporting structure 500. Note that the inclined surface 104 of the upper module assembly, whose position is indicated by lines 105 and 106, now forms a rear exit duct or opening 107 for cooling air emanating from the top of the lower module assembly. Either or both module assemblies may be opened for maintenance, but when both are opened, individual page modules should be positioned so that page modules in the upper module assembly which are supported by the shelves are not directly above page modules in the lower modules assembly which are also supported by shelves. This is to avoid inteference with air flow through the lower page modules. It will also be apparent that, depending on the size of the individual module assemblies, more than two such asemblies could be stacked vertically. It will further be noted that typically intermodular data line connections, power lines and compressed air supplies would pass through the vertical columns 401.

Figure 6:
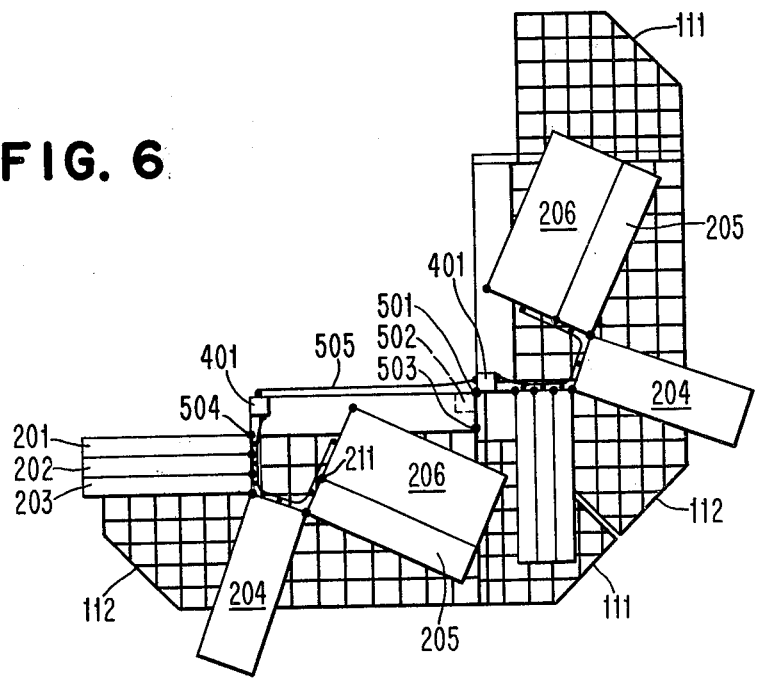
FIG. 6 is a top view of the packaging assembly shown in FIGS. 5A and 5B in a "open-for-servicing" configuration.
Figure 5A:
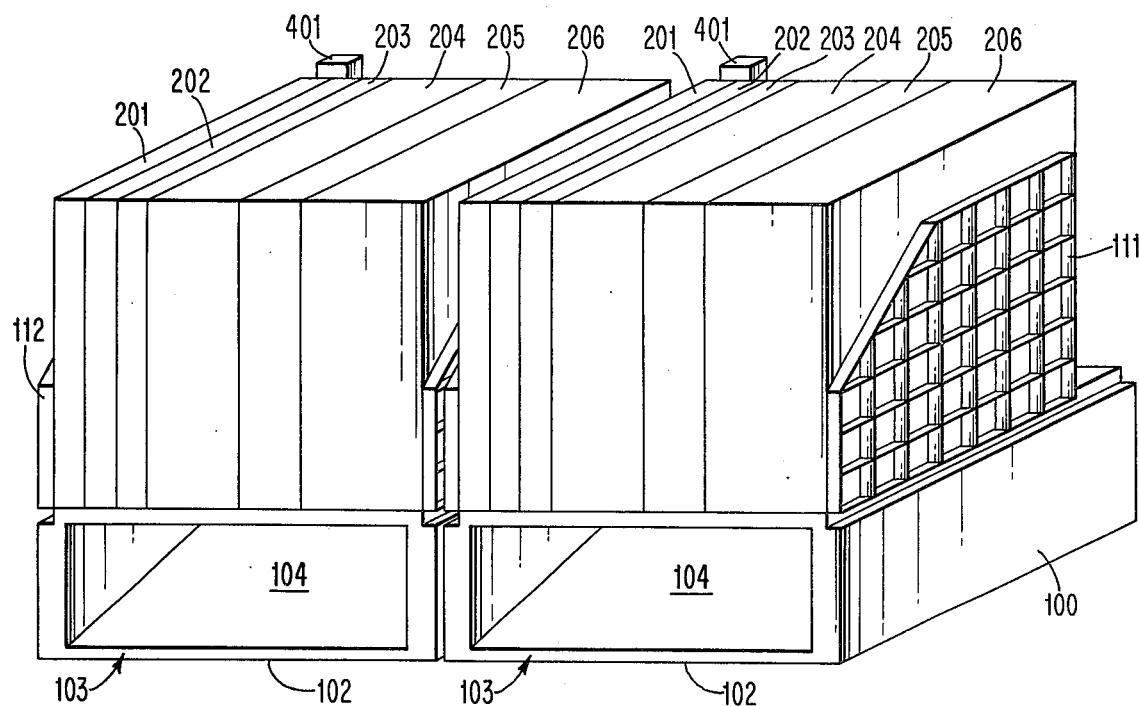
FIG. 5A is an isometric view showing two packaging assemblies of the type shown in FIG. 1 in a horizontally stacked configuration.
Figure 5B:
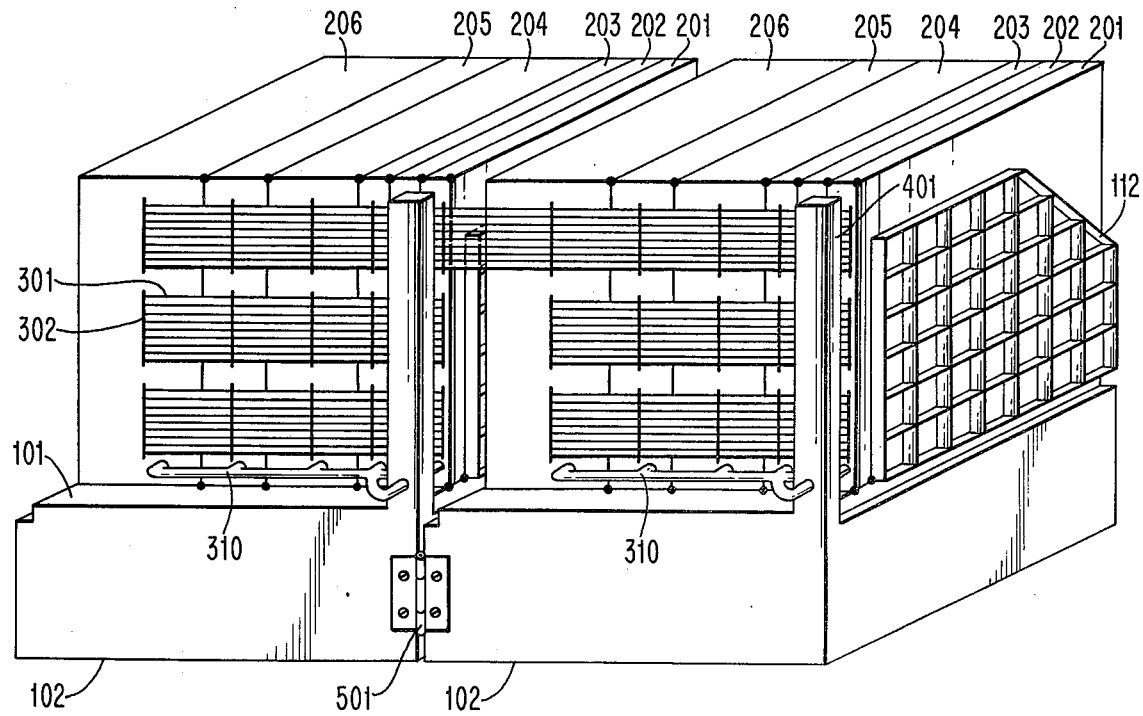
FIG. 5B is a rear isometric view of the structure of FIG. 5A.

FIGS. 5A and 5B are front and rear isometric views of two of the herein disclosed basic module assemblies grouped horizontally. FIG. 6 is a top view of such a grouping or assembly in which both module assemblies are opened for maintenance. In this arrangement the base support assemblies and air inlet structures would preferably be hinged together at point 501 and the adjacent shelves 111 and 112 between the two module assemblies are modified as shown in FIG. 6 to eliminate interference and to provide a continuous supporting surface for the individual page modules when open. When critical length signal connections such as indicated by the numeral 505 between the two assemblies exist, such connections of necessity pass through the columns 401. It would be preferable that said input/output columns 401 of the left hand module assembly be located at the position indicated by the dotted line 502. Also, the modules in the left hand module assembly should preferably be repositioned so that the fixed locating pin for the right most page module would be at point 503 and the hinged module assembly would open from this point rather than from point 504 at the left hand portion as shown.

It will be noted that in FIGS. 4A and 4B, 5A and 5B and FIG. 6 that only those reference numerals specifically mentioned in the specification are included in these figures, it being understood that identical members of each of these overall module assemblies would have the same reference numerals as shown in FIGS. 1, 2 and 3.

The above description of FIGS. 4, 5 and 6 completes the description of the presently disclosed preferred embodiment of the invention. The present invention comprises a unique modular packaging system for digital electronic computers and the like. While many changes in form and details may be made within the spirit and scope of the present invention, the unique features of the packaging system are the use of vertical hinged pages or modules wherein the particular hinging arrangement allows extreme flexibility in servicing and maintenance while at the same time maintaining an invariant electrical and thermal environment for the circuitry. These advantages are obtained by the unique support structure including the foraminous surfaces of both the base member and the hinged shelves which support the page modules when in the open position and also by the unique intermodule hinging arrangement which allows the use of very short and fixed length minimum delay interconnecting transmission lines for data, power cables, and in the preferred embodiment, a pressurized cooling fluid conduit.

Although many structures have been suggested for such electronic packaging systems none is known which incorporates the particular structural organization and arrangements set forth herein.

While the invention has been set forth and described with reference to a preferred embodiment together with a number of additional simple variations, it will be readily apparent that various modifications, adaptations, and alterations may be made by those skilled in the art without departing from the spirit and scope of the invention as set forth in the following claims.

What is claimed is:

1. An electronic packaging system comprising a minimum electrical delay module assembly including a base support assembly and a hinged module assembly mounted thereon, said base support assembly including a foraminous base member for supporting said hinged module assembly, an air chamber located under said base member for assuring an unrestricted flow of ambient air up through said base member, said hinged module assembly comprising a plurality of vertically disposed page modules of substantially the same height and depth, hinge means connecting and hinging each page module to each adjacent page module, said hinge means being adapted to allow all of said page modules to physically abut each other in a parallel arrangement when said hinged module assembly is closed wherein all of said vertical hinge means connecting said page modules lie substantially in a common plane, flexible electrical conductor means for interconnecting said page modules and connected to each said page module along the edge thereof adjacent and parallel to said hinge plane, the length of said conductors being fixed and determined by the distance between the connection points in each page module when said hinged module assembly is in the closed positon, and individual cooling means carried within each said page module, the cooling means including means for causing ambient air to pass up through the bottom of the individual page module and out the top thereof.

2. An electronic packaging system as set forth in claim 1 including an integral foraminous shelf means mounted on said base assembly said shelf means including hinging means attaching said shelf assembly to said base assembly whereby said shelf assembly provides a planar support surface with said base member for supporting said hinged module assembly when in the "open-for-service" position.

3. An electronic packaging system as set forth in claim 2 including air inductor cooling means which requires a pressurized air source located adjacent to the the bottom of each said page module, flexible conduit means connected to each said page module in the edge thereof closest to and lying parallel to said hinge plane for connecting said air induction cooling means in each page module to a common pressurized air source in said base assembly.

4. An electonic packaging assembly as set forth in claim 3 wherein said integral shelf members and said base member comprise rigid open gratings to provide for the unrestricted flow air therethrough.

5. An electronic packaging system as set forth in claim 4 including a fixed vertical column located on the top of said base assembly in non-interferring relationship with said hinged page assembly when in the closed position, the individual page module closest to said vertical column being fixedly hinged with respect to said base member, and flexible cable and conduit assemblies connecting said vertical column to said closest page module.

6. An electronic packaging system as set forth in claim 3 including support means for individually supporting a plurality of said minium delay module assemblies vertically disposed with respect to each other, cable and conduit means for interconnecting said module assemblies via said vertical columns said support means including means for spacing the individual module assemblies sufficiently that each hinged module assembly may be opened without interferring with or touching another module assembly located above or below the particular assembly.

7. An electronic packaging system as set forth in claim 6 including means for supporting a plurality of individual minimum delay module assemblies on a horizontal surface, hinge means for vertically hinging the base support assemblies for each module assembly together whereby each module assembly is vertically hinged to each adjacent module assembly at opposite corners of said base support assemblies said integral support shelves being so shaped that when any two module assemblies are opened a predetermined amount, the two adjacent shelves, when hinged down to be coplanar with their individual base numbers, form a substantially continuous support surface between said two module assemblies.

8. An electronic packaging system comprising a minimum electrical delay module assembly including a base support assembly and a hinged module assembly mounted thereon, said base support assembly including a foraminous base member for supporting said hinged module assembly, an air chamber located under said base member for assuring an unrestricted flow of ambient air up through said base member, said hinged module assembly comprising a plurality of vertically disposed page modules of substantially the same height and depth, each said page module having a width w, said page modules being so disposed as to have a first configuration wherein they physically abut each other and lie in parallel arrangement, whereby all said page modules have one edge comprising a hinge surface of width w lying in a common plane, vertical hinge means for connecting each page module to an adjacent module, one hinge means being provided for each end page module, two hinge means being provided for interior page modules having two adjacent neighbors, the two hinge means for each interior page module having axes spaced a distance substantially equal to the width of that module, flexible electrical conductor means for interconnecting said page modules and connected to each said page module in the hinge surface thereof, the length of said conductors being fixed and determined by the distance between the connection points in each page module when said hinged module assembly is in said first configuration, and individual cooling means carried within each said page module, the cooling means including means for causing ambient air to pass up through the bottom of the individual page module and out the top thereof.

9. An electronic packaging system as set forth in claim 8 wherein all of said hinge axes lie within a common plane when said hinged module assembly is in said first configuration.

10. An electronic packaging system as set forth in claim 9 wherein said common hinge plane is substantially coextensive with the common plane including all of said page module hinge surfaces.

11. An electronic packaging system as set forth in claim 10 including removable connector means for physically connecting said flexible electrical conductor means to each said page module, said connector means being adapted for insertion into a complementary member located in said hinge surface of each said page module.

12. An electronic packaging system as set forth in claim 11 including locking means for fixedly securing all of said page modules together and to said support assembly in said first configuration.

* * * * *